United States Patent [19]
Devitt et al.

[11] Patent Number: 5,198,385
[45] Date of Patent: Mar. 30, 1993

[54] PHOTOLITHOGRAPHIC FORMATION OF DIE-TO-PACKAGE AIRBRIDGE IN A SEMICONDUCTOR DEVICE

[75] Inventors: Douglas J. Devitt; Edward S. Wrasmann, both of Melbourne, Fla.

[73] Assignee: Harris Corporation, Melbourne, Fla.

[21] Appl. No.: 640,041

[22] Filed: Jan. 11, 1991

[51] Int. Cl.$^5$ .................. H01L 21/60; H01L 21/84
[52] U.S. Cl. ................................ 437/51; 437/182; 437/205
[58] Field of Search ............... 437/51, 205, 182, 209; 357/68, 71

[56] References Cited

U.S. PATENT DOCUMENTS

| | | | |
|---|---|---|---|
| 4,289,846 | 9/1981 | Parks et al. | 437/182 |
| 4,308,090 | 12/1981 | Te Velde et al. | 437/192 |
| 4,418,470 | 12/1983 | Naster et al. | 437/40 |
| 4,466,181 | 8/1984 | Takishima et al. | 437/209 |
| 4,542,397 | 9/1985 | Biegelsen et al. | 437/211 |
| 4,722,914 | 2/1988 | Drye et al. | 437/213 |
| 4,990,462 | 2/1991 | Sliwa, Jr. | 437/51 |

FOREIGN PATENT DOCUMENTS

| | | | |
|---|---|---|---|
| 0222144 | 5/1987 | European Pat. Off. | |
| 57-155227 | 3/1984 | Japan | |
| 62-158336 | 7/1987 | Japan | |
| 61-158337 | 7/1987 | Japan | |
| 62-285459 | 12/1987 | Japan | 437/211 |
| 1-67928 | 3/1989 | Japan | 437/51 |
| 2130794 | 6/1984 | United Kingdom | |

*Primary Examiner*—Olik Chaudhuri
*Assistant Examiner*—David E. Graybill
*Attorney, Agent, or Firm*—Evenson, Wands, Edwards, Lenahan & McKeown

[57] ABSTRACT

Bond sites on an integrated circuit chip are connected to bond sites on a package by photolithographically defining and selectively plating an air bridge between the chip and spaced-apart metallized bond regions of the package. A layer of dry photoresist is laminated onto top surfaces of each of the chip and the support package, so that photoresist bridges an air gap between the chip and the package. Next, the masking material is patterned, to expose the bond sites on the chip and the package. Over the entirety of the patterned structure, a thin plating-seed barrier metal layer is non-selectively formed. The seed metal layer is then covered with a second mask layer which is photolithographically patterned to expose a portion of the barrier seed metal layer extending between bond sites of the chip and the package. A second relatively thick metal layer is electroplated on the exposed seed metal layer, to form a conductive bridge between the chip and the package. A photoresist wash removes the second mask layer, thereby exposing the thin seed metal adjacent to the bridge. Using the plated metal layer as a mask, that portion of the seed metal layer exposed by the removal of the second layer of masking material is etched down to the surface of the first mask. Finally, the initial photomask layer is etched away, leaving the chip and package bond sites interconnected by an air bridge containing two metal layers.

10 Claims, 3 Drawing Sheets

PHOTOLITHOGRAPHIC FORMATION OF DIE-TO-PACKAGE AIRBRIDGE IN A SEMICONDUCTOR DEVICE

FIELD OF THE INVENTION

The present invention relates in general to semiconductor packaging and is particularly directed to a process for forming narrow pitch interconnect links between internal bond sites on a semiconductor die and outer package bond sites disposed around and spaced apart from the die.

BACKGROUND OF THE INVENTION

As a result of continued improvements in semiconductor materials and wafer processing techniques, integrated circuit topologies are currently capable of being fabricated at submicron line width resolution. Unfortunately, conventional chip-to-package interconnect processing, such as flip chip, beam lead, wire bonding or tape automated bonding (of which wire bonding and TAB are the only practical schemes for high density, high reliability packaging), has not kept pace. Wire bonding systems, for example, customarily require a large pitch (on the order of 5-6 mils between bond sites). TAB processing, on the other hand, requires expensive hard tooling and lengthy preparation cycles to produce the tape, which itself has a practical limit to the pitch of the leads (on the order of 4 mils) that can be economically produced in quantity.

SUMMARY OF THE INVENTION

In accordance with the present invention, the limited resolution and hardware complexity and cost shortcomings of conventional die-to-package interconnect schemes are substantially obviated by a new and improved methodology, which effectively applies photolithographic wafer processing techniques to a larger scale packaging environment in order to form a die bond site-to-package bond site interconnect air bridge structure having a resolution considerably finer than currently employed technologies and thereby able to augment the semiconductor real estate usage efficiency of the die.

More particularly, pursuant to the present invention, bond sites on an integrated circuit chip are conductively connected to respective bond sites on a surrounding support package by photolithographically defining and selectively plating an air bridge structure between the chip and spaced-apart metallized bond regions of the package. The bond site of the support package may be that of a separate semiconductor circuit device captured within a cavity in the support package. Moreover, the support package may comprise a co-fired laminate structure of interconnect-containing ceramic layers. The improved interconnect process entails the following sequence of steps.

Initially a layer of dry photoresist material is laminated onto the top surfaces of each of the semiconductor die and the support package, so that the layer of dry photoresist bridges an air gap between the die and the package. Next, the layer of solid masking material is selectively patterned, so as to form respective apertures exposing the respective bond sites o the die and the package that are to be interconnected with one another. The apertures exposed by this patterning step are preferably tapered (e.g. on the order of 30°), so as to relieve stresses within a subsequently formed metallization structure.

Over the entirety of the patterned structure, a thin plating-seed metal layer is non-selectively formed. Preferably, the seed metal layer is a barrier metal so that it does not form an intermetallic interface with exposed semiconductor material of either the die or the package. The seed metal layer is then covered with a second mask layer which, in turn, is photolithographically patterned so as to expose that portion of the barrier seed metal layer that extends between and conductively interconnects the respective bond sites of the die and the package. A second, relatively thick metal layer is then electroplated on the exposed seed metal layer, so as to form a conductive bridge between the die and the package. A photoresist wash is then applied to remove the second layer of masking material, thereby exposing the thin seed metal adjacent to the bridge.

Using the plated metal layer as a mask, that portion of the seed metal layer exposed by the removal of the second layer of masking material is etched down to the surface of the first mask. Finally, the initial photomask layer is etched away, thereby leaving the die and package bond sites interconnected by an air bridge structure containing the two metal layers.

Advantageously, because the interconnect method of the present invention utilizes well established photolithographic processing steps commonly employed in wafer fabrication, not only is no hard tooling (as in TAB processing) necessary, but (very narrow pitch) interconnect layout parameters can be readily adjusted through software, which reduces considerably the cycle time for new devices. Additionally, no organic materials remain after the final rinse (leaving the entire interconnect structure as a metal bridge) thereby complying with military class S requirements.

DETAILED DESCRIPTION

Figure 1:
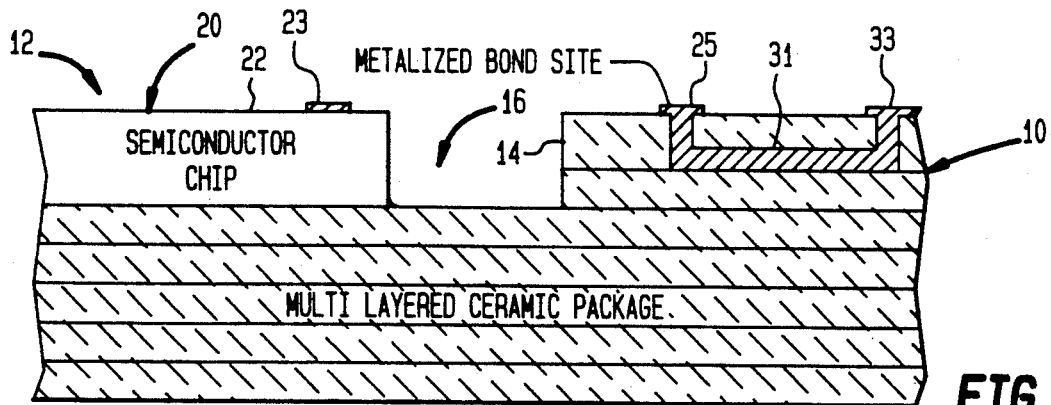
FIGS. 1-10 are diagrammatic cross-sectional illustrations of a semiconductor die and package at successive stages of manufacture of a die-to-package interconnect structure in accordance with the process of the present invention.

Referring now to the drawings, FIG. 1 diagrammatically shows, in cross-section, an integrated circuit package 10 comprised of a co-fired multilayer ceramic laminate structure having a cavity region 12 to which a semiconductor die 20 is attached (e.g. by way of a eutectic or metallized glass bond), and a surrounding wall portion 14, spaced apart from die 20 by an air gap 16. Formed on the top surface 22 of semiconductor die 20 is a (metallized) bond site 23, which is to be interconnected to a respective metallized bond site 25 on the top surface 26 of the surrounding wall portion 14 of the support package. The bond site of the support package may be simply a fan-out base location or it may be formed on a separate semiconductor circuit device captured within a cavity in the wall portion of the support package. For purposes of an exemplary embodiment bond site 25 is shown as connected via a laminate interconnect 31 to an outer surface metallization 33. As described briefly above, pursuant to the process according to the present invention a metallic air bridge is to be photolithographically defined and selectively plated between bond site 23 on die 20 and the spaced-apart metallized bond site 25 of package 10.

Figure 2:
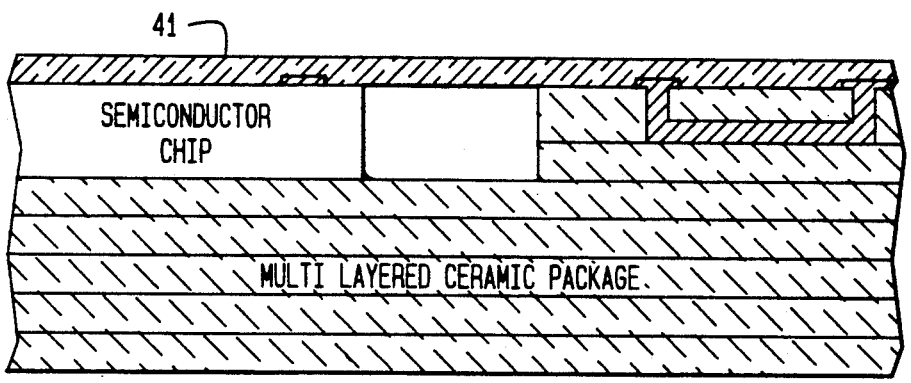
Figure 3:
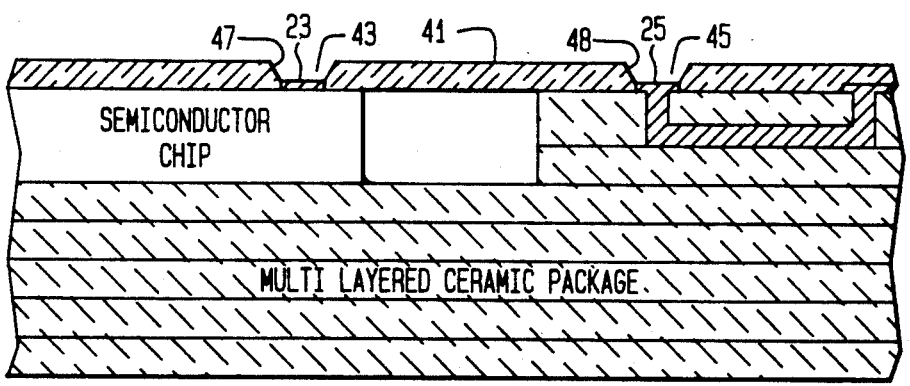

For this purpose, as shown in FIG. 2, a layer of dry photoresist material 41 (e.g. "Riston", Trademark DuPont, having a thickness on the order of 1.6 mils) is laminated (by a conventional heat/pressure step) onto the top surfaces 22, 26 of semiconductor die 20 and support package 10, respectively, so that photoresist layer 41 bridges air gap 16 between the die and the package. Next, as shown in FIG. 3, photoresist layer 41 is selectively patterned into a masking layer having respective apertures 43, 45 exposing respective bond sites 23, 25 on the die and the package that are to be interconnected with one another. Preferably, apertures 43, 45 are tapered (e.g. on the order of 30°), so as to form sloped sidewalls 47, 48, so as to provide tapered land portions and consequential stress relief of the metallization layers to be subsequently formed.

Figure 4:
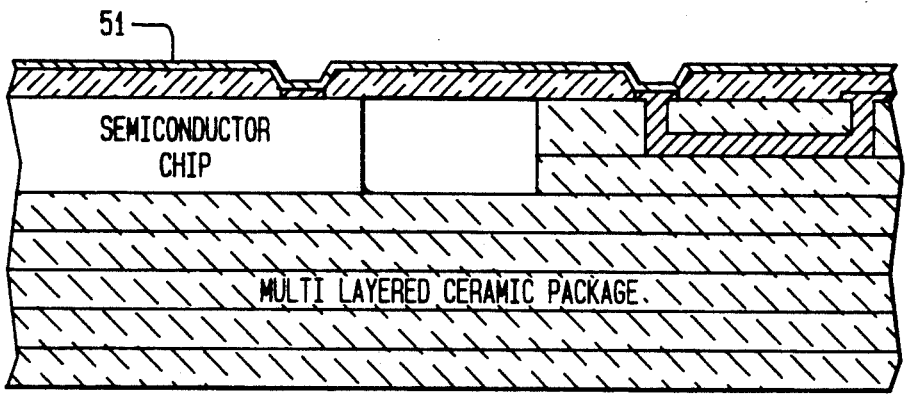
Figure 5:
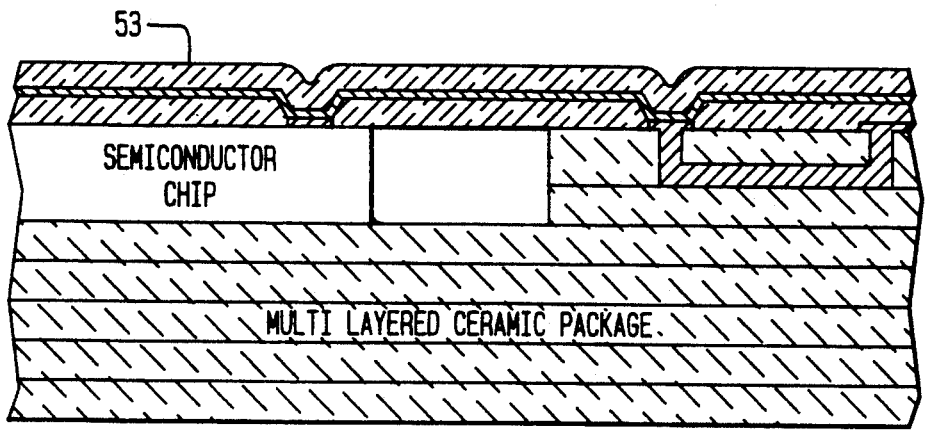
Figure 6:
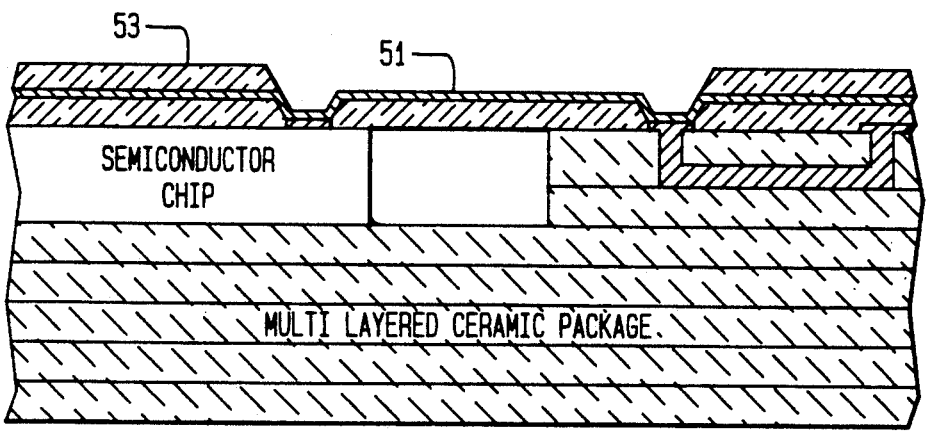

Next, as depicted in FIG. 4, over the entirety of the patterned structure of FIG. 3, a thin plating-seed metal film 51 (e.g. a barrier metal such as chromium/copper) is non-selectively conformally deposited to a thickness on the order of 2000–8000° The seed metal film is preferably a barrier metal so that it does not form an intermetallic interface with exposed surface material of either the die or the package. Following conformal deposition, seed metal film 51 is covered with a second layer 53 of photoresist material (e.g. liquid photoresist), as shown in FIG. 5. Photoresist layer 53 is then photolithographically patterned as illustrated in FIG. 6, so as to expose that portion 55 of barrier seed metal film 51 which extends between and conductively interconnects the respective bond sites of the die and the package.

Figure 7:
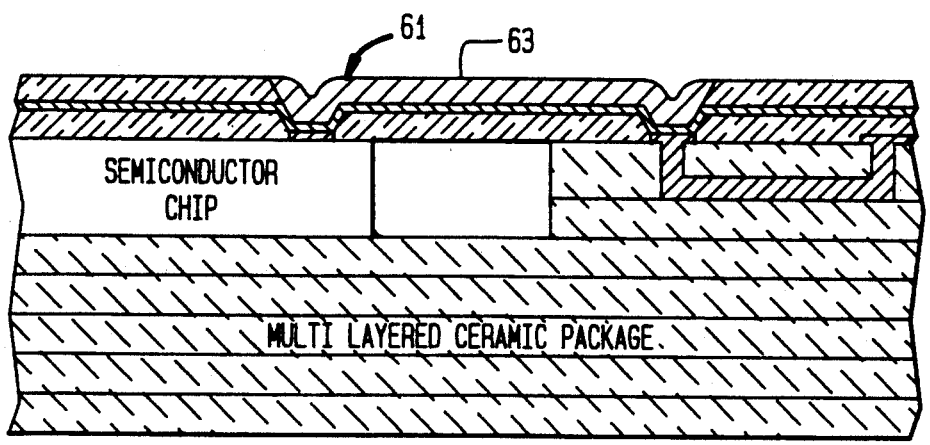
Figure 8:
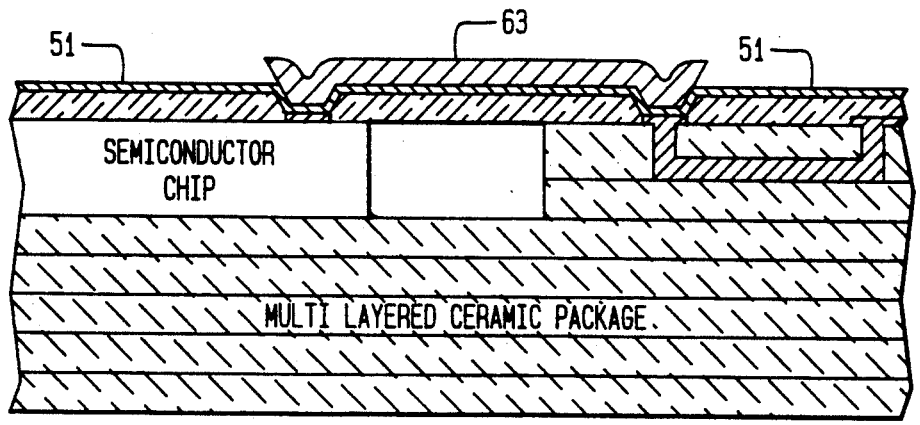

After patterning resist layer 53, a second, relatively thick metal layer is electroplated o the exposed portion 55 of seed metal film 51, so as to form a conductive bridge 61 between the die and the package, as shown in FIG. 7. Next, as shown in FIG. 8, a photoresist etch-/wash is then applied to remove the second photomask layer 53, thereby exposing that portion 63 of the thin seed metal film 51 adjacent to the bridge.

Figure 9:
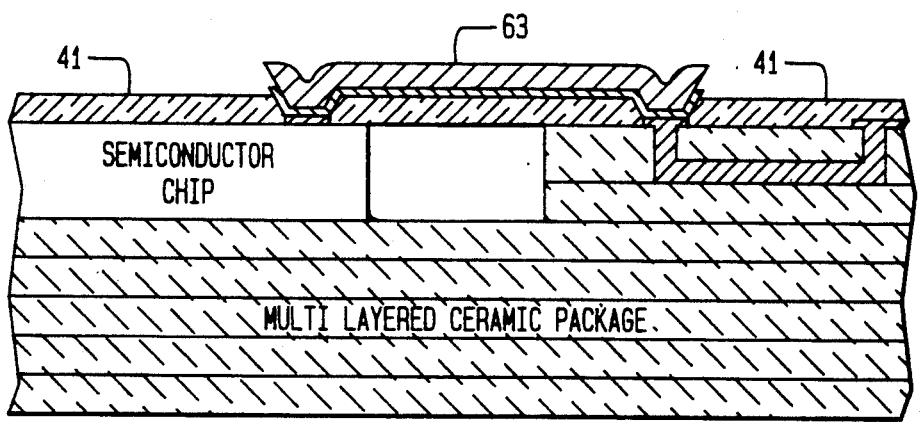
Figure 10:
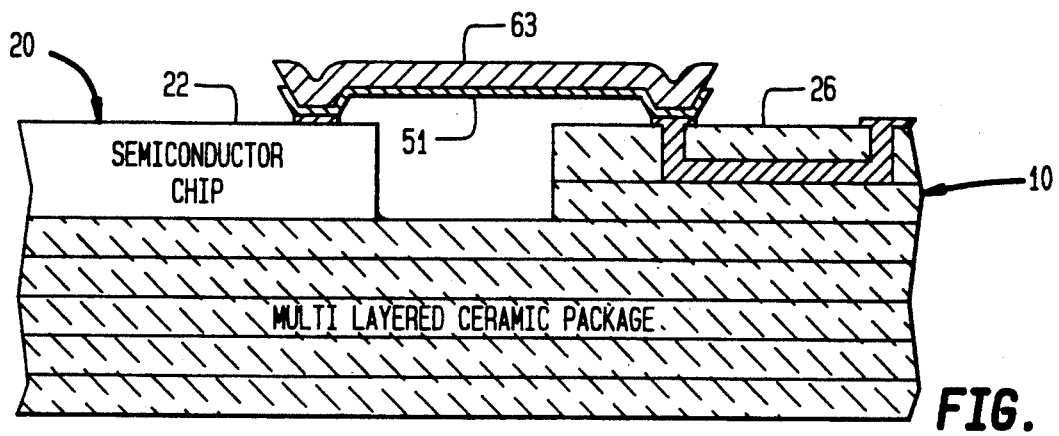

Then, using plated metal bridge layer 61 as a mask, portion 63 of the seed metal film 51 exposed by the removal of the second masking layer 53 is etched, so that all of the exposed seed metal layer is removed down to the surface of the first mask layer 41, as illustrated in FIG. 9. Finally, as depicted in FIG. 10, the remainder of the initial photomask layer 41 is completely etched away, thereby leaving the die and package bond sites 23, 25 interconnected by an air bridge structure 61 containing the two metal layers 51, 53.

As pointed out above, since the interconnect method of the present invention utilizes well established photolithographic processing steps commonly employed in wafer fabrication, interconnect pitch dimensions not realizable with TAB processing or wire bonding techniques are readily obtainable. Moreover, there is no need for hard tooling; the interconnect scheme herein described may be readily adjusted through software, thereby considerably reducing the cycle time for new devices. Finally, military class S requirements are satisfied as no organic materials remain after the final rinse, which leaves the entire interconnect structure as a metal bridge.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein out intend to cover all such changes and modifications as are obvious to one of ordinary skill in the art.

What is claimed is:

1. A method of providing a conductive interconnection from a first interconnect site on a semiconductor circuit component, that is supported on a support package, to a second interconnect site at a location of said support package spaced apart from said semiconductor circuit component by an air gap therebetween comprising the steps of:
   (a) bridging said semiconductor circuit component and said location of said support package with a first layer of masking material, such that the air gap therebetween remains beneath said first layer of masking material;
   b) selectively patterning said first layer of masking material so as to form first and second apertures exposing said first and second interconnect sites that are to be conductively interconnected with one another;
   (c) non-selectively forming a first metal layer on the structure resulting from the execution of step (b);
   d) selectively forming a second layer of masking material on the structure resulting from step (c) so as to expose that portion of said first metal layer that extends between and conductively interconnects said first and second interconnect sites;
   e) forming a second metal layer on the conductively interconnecting portion of said first metal layer exposed by step (d);
   (f) removing said second layer of masking material;
   (g) using said second metal layer as a mask, removing that portion of said first layer exposed by the removal of said second layer of masking material; and
   (h) removing said first layer of masking material, thereby leaving said first and second interconnect sites and said air gap bridged by a metal structure containing said first and second metal layers.

2. A method according to claim 1, wherein said first metal layer comprises a barrier metal layer.

3. A method according to claim 1, wherein said semiconductor circuit component comprises a semiconductor die on a top surface of which said first interconnect site is located, and wherein said second interconnect site is located on a semiconductor component captured within a wall portion of said support package, said package being formed of an interconnect-containing substrate.

4. A method according to claim 1, wherein step (a) comprises laminating a layer of dry photoresist material onto the top surfaces of each of said semiconductor circuit component and said package, so that said layer of dry photoresist bridges said air gap between said semiconductor circuit component and said package.

5. A method according to claim 1, wherein step (e) comprises plating said second metal layer on the exposed portion of said first metal layer so as to form a thick metal structure extending across said air gap and interconnecting said first and second interconnect sites.

6. A method according to claim 1, wherein step (b) comprises selectively patterning said first layer of masking material so as to form first and second sloped sidewall apertures therethrough.

7. A method of providing a conductive interconnection from a first electrical bonding site, on a die containing at least one electrical device, said die being supported within a cavity of a support package, to a second electrical bonding site located on a wall portion of said package surrounding said cavity and spaced apart from said die by an air gap therebetween comprising the steps of:

(a) laminating a first layer of photoresist material to the top surface of each of said die and said wall portion of said package, so that said first layer of photoresist material overlies said air gap therebeneath and bridges said first electrical bonding site on said die and said second electrical bonding site on said wall portion of said package;

(b) selectively patterning said first layer of photoresist material so as to form first and second apertures exposing said first and second electrical bonding sites;

(c) non-selectively forming a first, plating seed metal film on the structure resulting from the execution of step (b);

(d) selectively forming a second layer of photoresist material on the structure resulting from step (c) so as to expose that portion of said first, plating seed metal film that extends between and conductively interconnects said first and second electrical bonding sites;

(e) plating a second metal layer on the exposed portion of said first, plating seed metal film;

(f) removing said second layer of photoresist material;

(g) using said second metal layer as a mask, removing that portion of said first, plating seed metal film exposed by the removal of said second layer of masking material in step (f); and (h) removing said first layer of photoresist material, thereby leaving said first and second electrical bonding sites conductively bridged by a multilayer metal structure.

8. A method according to claim 7, wherein said first, plating seed metal film comprises a barrier metal.

9. A method according to claim 7, wherein step (b) comprises selectively patterning said first layer of masking material so as to form first and second sloped sidewall apertures.

10. A method according to claim 7, wherein said second electrical bonding site is located on a semiconductor component captured within said wall portion of said package, said package being formed of an interconnect-containing substrate.

* * * * *